(12) United States Patent
Boston

(10) Patent No.: US 8,779,662 B2
(45) Date of Patent: Jul. 15, 2014

(54) PULSE MODE CAPABILITY FOR OPERATION OF AN RF/VHF IMPEDANCE MATCHING NETWORK WITH 4 QUADRANT, $V_{RMS}/I_{RMS}$ RESPONDING DETECTOR CIRCUITRY

(75) Inventor: Gerald E. Boston, Glenwood Springs, CO (US)

(73) Assignee: COMET Technologies USA, Inc, San Jose, CA (US)

( * ) Notice: Subject to any disclaimer, the term of this patent is extended or adjusted under 35 U.S.C. 154(b) by 938 days.

(21) Appl. No.: 12/908,738

(22) Filed: Oct. 20, 2010

(65) Prior Publication Data

US 2012/0098575 A1   Apr. 26, 2012

(51) Int. Cl.
   *G05F 3/00*   (2006.01)
(52) U.S. Cl.
   USPC ............ 315/111.21; 315/111.51; 315/111.71; 156/345.28; 156/345.44; 156/345.48

(58) Field of Classification Search
   USPC ............ 315/111.11, 111.21, 111.31, 111.41, 315/111.51, 111.61, 111.71, 111.81, 315/111.91; 156/345.28, 345.48, 345.49
   See application file for complete search history.

*Primary Examiner* — Douglas W Owens
*Assistant Examiner* — Jonathan Cooper
(74) *Attorney, Agent, or Firm* — Edmonds & Nolte, PC

(57) ABSTRACT

A physical vapor deposition system may include an RF generator configured to supply a pulsing AC process signal to a target in a physical vapor deposition chamber via the RF matching network. A detector circuit may be coupled to the RF generator and configured to sense the pulsing AC process signal and to produce a corresponding pulsing AC voltage magnitude signal and pulsing AC current magnitude signal. An envelope circuit may be electrically coupled to the detector circuit and configured to receive the pulsing AC voltage and current magnitude signals and to produce a DC voltage envelope signal and a DC current envelope signal. A controller may be electrically coupled to the envelope circuit and the RF matching network and configured to receive the DC voltage and current envelope signals and to vary an impedance of the RF matching network in response to the DC voltage and current envelope signals.

20 Claims, 4 Drawing Sheets

US 8,779,662 B2

PULSE MODE CAPABILITY FOR OPERATION OF AN RF/VHF IMPEDANCE MATCHING NETWORK WITH 4 QUADRANT, $V_{RMS}/I_{RMS}$ RESPONDING DETECTOR CIRCUITRY

BACKGROUND

Physical vapor deposition ("PVD") systems are used to deposit thin layers of a target material onto a substrate. PVD systems generally include a radio frequency ("RF") generator that transmits a continuous and/or pulsing signal to a deposition chamber. An RF match having a variable impedance is generally located between the RF generator and the chamber. The RF match may be tuned, i.e., the impedance may be varied, to make the impedance of the RF match be the complex conjugate of the deposition chamber's impedance. Tuning the RF match reduces reflected power from the chamber, thereby increasing the power transferred from the RF generator to the deposition chamber and into the plasma deposition process.

Oftentimes the RF generator is run in pulse mode and transmits a pulsing AC signal to the deposition chamber rather than a continuous AC signal. Conventional RF matches, however, cannot be actively tuned while the RF generator is in pulse mode. Instead, the conventional RF match is tuned while the RF generator is run in continuous mode. Once the RF match is tuned, the impedance of the RF match is fixed, and the RF generator is switched to pulse mode. Although the chamber impedance may vary while the RF generator is running in pulse mode, the RF match impedance remains fixed resulting in reflected power from the chamber. There is a need, therefore, for systems and methods for actively tuning an RF match for a deposition chamber while the RF generator is running in pulse mode.

SUMMARY OF THE INVENTION

Embodiments of the disclosure may provide a method for tuning an RF matching network during pulsed mode operation. The method may include sensing a pulsing AC process signal being transmitted from an RF generator to a target in a physical vapor deposition chamber via the RF matching network with a detector circuit. The method may also include generating a DC voltage envelope signal and a DC current envelope signal corresponding to the sensed pulsing AC process signal with an envelope circuit electrically coupled to the detector circuit. The method may further include tuning the RF matching network with a controller electrically coupled to the RF matching network and the envelope circuit in response to the voltage and current envelope signals, wherein the RF matching network is tuned while the RF generator transmits the pulsing AC process signal to the target in the physical vapor deposition chamber via the RF matching network.

Embodiments of the disclosure may also provide a system for tuning an RF matching network during pulsed mode operation. The system may include an RF generator configured to supply a pulsing AC process signal to a target in a physical vapor deposition chamber via the RF matching network. A detector circuit may be coupled to the RF generator and configured to sense the pulsing AC process signal and to produce a corresponding pulsing AC voltage magnitude signal and pulsing AC current magnitude signal. An envelope circuit may be electrically coupled to the detector circuit and configured to receive the pulsing AC voltage and current magnitude signals and to produce a DC voltage envelope signal and a DC current envelope signal. A controller may be electrically coupled to the envelope circuit and the RF matching network and configured to receive the DC voltage and current envelope signals and to vary an impedance of the RF matching network in response to the DC voltage and current envelope signals.

Embodiments of the disclosure may further provide a method for tuning an RF matching network for a plasma deposition chamber during pulse mode operation. The method may include transmitting a pulsing AC process signal from an RF generator to the plasma deposition chamber via the RF matching network. The method may also include sensing the pulsing AC process signal with a detector circuit coupled to the RF generator. The method may further include producing a pulsing AC voltage magnitude signal and a pulsing AC current magnitude signal with the detector circuit. The method may further include receiving and converting the pulsing AC voltage and current magnitude signals into a DC voltage envelope signal and a DC current envelope signal with an envelope circuit electrically coupled to the detector circuit. The method may further include varying an impedance of the RF matching network with a controller in response to the DC voltage and current envelope signals to reduce reflected power from the plasma deposition chamber, the controller being electrically coupled to the envelope circuit and the RF matching network.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
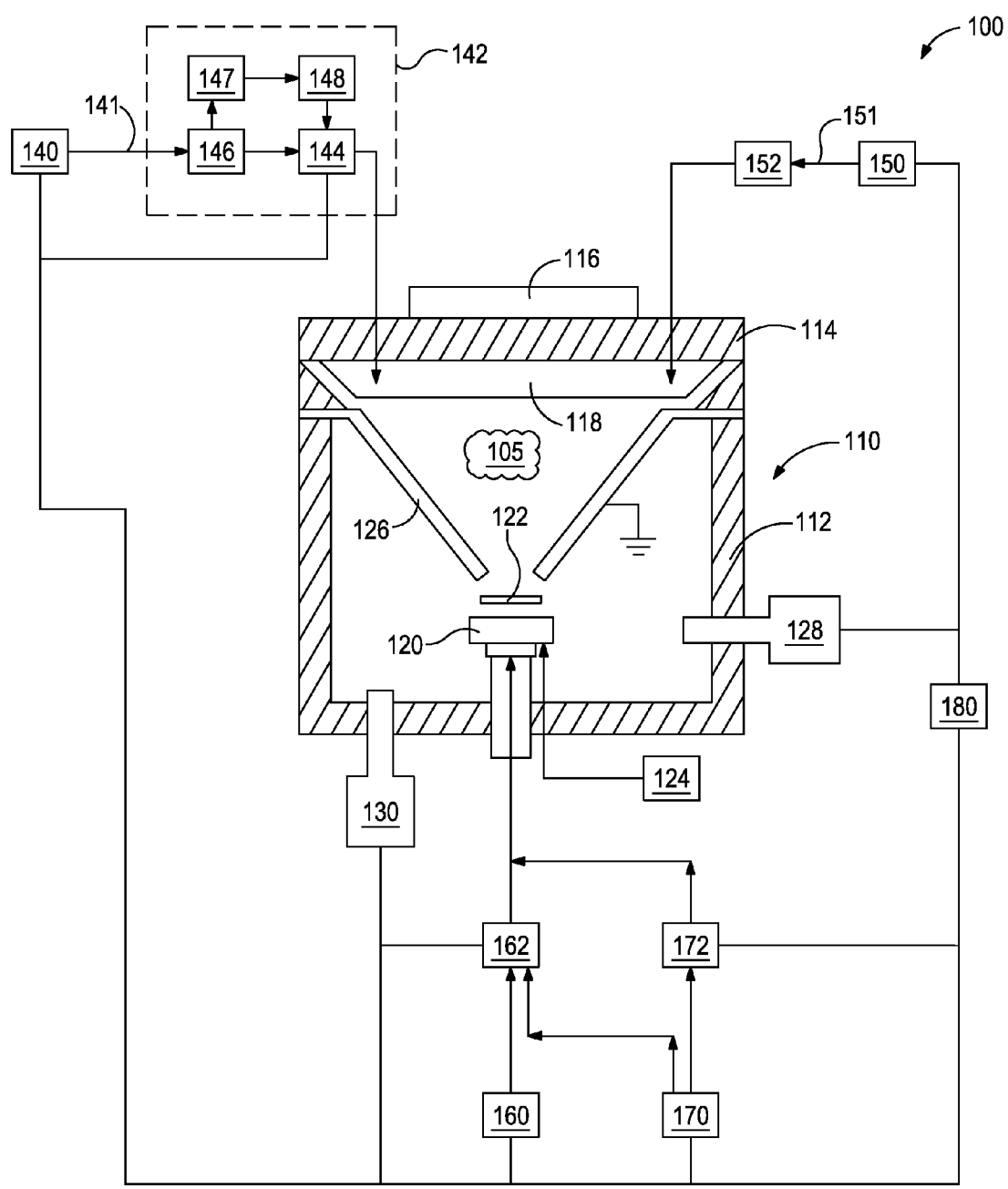
FIG. 1 illustrates an exemplary physical vapor deposition system, according to one or more embodiments described.

It is to be understood that the following disclosure describes several exemplary embodiments for implementing different features, structures, or functions of the invention. Exemplary embodiments of components, arrangements, and configurations are described below to simplify the present disclosure, however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Further, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

FIG. 1 illustrates an exemplary physical vapor deposition ("PVD") system 100 of the disclosure. The PVD system 100 includes a chamber 110 having a body 112 and a lid or ceiling 114. A magnet assembly 116 may be disposed on an outer side of the lid 114. In at least one embodiment, the magnet assembly 116 may be a permanent magnet disposed on a plate that is rotated by a motor between about 0.1 and about 10 revolutions per second. For example, the magnet assembly 116 may rotate in a counterclockwise direction at about 1 revolution per second.

A target 118 is generally positioned on an inner side of the lid 114 opposite the magnet assembly 116. In at least one embodiment, the target 118 may be at least partially composed of, but is not limited to, elements such as, borides, carbides, fluorides, oxides, silicides, selenides, sulfides, tellerudes, precious metals, alloys, intermetallics, or the like. For example, the target 118 may be composed of copper (Cu), silicon (Si), gold (Au), titanium (Ti), tantalum (Ta), tungsten (W), aluminum (Al), a combination or alloy thereof, or the like.

A pedestal 120 may be disposed in the chamber 110 and configured to support a substrate 122. In at least one embodiment, the pedestal 120 includes a chuck configured to hold the substrate 122 to the pedestal 120. Suitable chucks may include mechanical chucks, vacuum chucks, electrostatic chucks ("e-chucks"), or the like. Mechanical chucks include one or more clamps to hold the substrate 122 to the pedestal 120. Vacuum chucks include a vacuum aperture coupled to a vacuum source to hold the substrate 122 to the pedestal 120. E-chucks rely on the electrostatic pressure generated by an electrode to hold the substrate 122 to the pedestal 120. In at least one embodiment, the pedestal 122 may be or include an e-chuck powered by a DC power supply 124.

A shield 126 may at least partially surround the pedestal 120 and the substrate 122 and be electrically grounded, for example, by physical attachment to the chamber body 112. The shield 126 is generally configured to receive deposition particles that would normally deposit on the interior walls of the chamber 110 during the PVD process.

A gas supply 128 may be coupled to the chamber 110 and configured to introduce a controlled flow of a process gas into the chamber 110. In at least one embodiment, the process gas introduced to the chamber 110 may include Argon (Ar), Nitrogen ($N_2$), Hydrogen ($H_2$), Helium (He), Xenon (Xe), a combination thereof, or the like.

A vacuum pump 130 may be coupled to the chamber 110 and configured maintain a desired sub-atmospheric pressure or vacuum level in the chamber 110. In at least one embodiment, the vacuum pump 130 may maintain a pressure between about 1 and about 100 millitorrs in the chamber 110 during a deposition process.

A first radio frequency ("RF") generator 140 may be configured to supply an AC process signal 141 at a frequency F1 to the target 118 in the chamber 110. In at least one embodiment, F1 may be between about 300 Hz and about 300 MHz. For example, F1 may be between about 30 MHz and about 162 MHz. The RF generator 140 may be configured to operate in continuous mode or pulse mode, i.e., the process signal 141 may pulse on and off rather than stream continuously.

A first RF match system 142 may be coupled to the RF generator 140 and configured to decrease reflected power from the load, i.e., the chamber 110, thereby increasing the power transferred from the RF generator 140 to the chamber 110. The RF match system 142 may be or include an RF matching network 144 having a variable or adjustable impedance. The power transfer from the first RF generator 140 to the chamber 110 via the RF matching network 144 is maximized when the impedance of the RF matching network 144 is adjusted to equal or approximate the complex conjugate of the impedance of the chamber 110. In at least one exemplary embodiment, when the impedance of the RF matching network 144 reaches the complex conjugate of the impedance of the chamber 110, the RF generator 140 will see an impedance of about 50 ohms at the input of the RF matching network 144.

A detector circuit 146 may be coupled to or be part of the RF match system 142. The detector circuit 146 may be configured to detect or sense the process signal 141 from the RF generator 140 and to generate a voltage magnitude signal and a current magnitude signal representative of the process signal 141.

An envelope circuit 147 may also be coupled to or be part of the RF match system 142. When the RF generator 140 is in pulse mode, the envelope circuit 147 may be configured to receive pulsing voltage and current magnitude signals from the detector circuit 146 and to produce a voltage envelope signal and a current envelope signal representative of the process signal 141.

A match controller 148 may be coupled to the RF matching network 144, the detector circuit 146, and/or the envelope circuit 147. In at least one embodiment, the match controller 148 may be coupled to or be part of the RF match system 142. In another embodiment, the match controller 148 may be coupled to or be part of an overall system controller 180. The match controller 148 may be configured to tune, i.e., adjust the impedance, of the RF matching network 144 in response to the voltage and current magnitude signals from the detector circuit 146 and/or the voltage and current envelope signals from the envelope circuit 147 to decrease reflected power from the chamber 110.

A DC generator 150 may supply a DC signal 151 to the target 118. A DC filter 152 may be coupled to the DC generator 150 and configured to block or prevent the process signal 141 and the corresponding harmonics from the RF generator 140 from reaching and damaging the DC generator 150.

A second RF generator 160 may be configured to supply an RF signal at a frequency F2 to the pedestal 120. The second RF generator 160 may be configured to operate in continuous mode or pulse mode. In at least one embodiment, the RF signal from the second RF generator 160 may be used to bias the chamber 110 and/or the pedestal 120. A second RF match system 162 may be coupled to and receive the signal from the second RF generator 160. The second RF match system 162 may be the same as the first RF match system 142, i.e., a double input match, or it may be a different component, as desired.

In at least one embodiment, a third RF generator 170 may be configured to supply an RF signal at a frequency F3 to the pedestal 120. The third RF generator 170 may be configured to operate in continuous mode and/or pulse mode. In at least one embodiment, the second RF generator 160 and the third RF generator 170 may be coupled to a single RF match system 162. In another embodiment, the third RF generator 170 may be coupled to a third RF match system 172. The third RF match may be the same as the first and/or second RF match system 142, 162, or it may be a different component, as desired. Although not shown, one or more additional RF generators and corresponding RF match systems may be implemented in the PVD system 100.

A system controller 180 may be coupled to one or more of the gas supply 128, the vacuum pump 130, the RF generators 140, 160, 170, and the DC generator 150. In at least one embodiment, the system controller 180 may also be coupled to one or more of the RF match systems 142, 162, 172. The system controller 180 may be configured to the control the various functions of each component to which it is coupled. For example, the system controller 180 may be configured to control the rate of gas introduced to the chamber 110 via the gas supply 128. The system controller 180 may be configured to adjust the pressure within the chamber 110 with the vacuum pump 130. The system controller 180 may be configured to adjust the output signals from the RF generators 140, 160, 170, and/or the DC generator 150. In at least one embodiment, the system controller 180 may be configured to adjust the impedances of the RF match systems 142, 162, 172.

Figure 2:
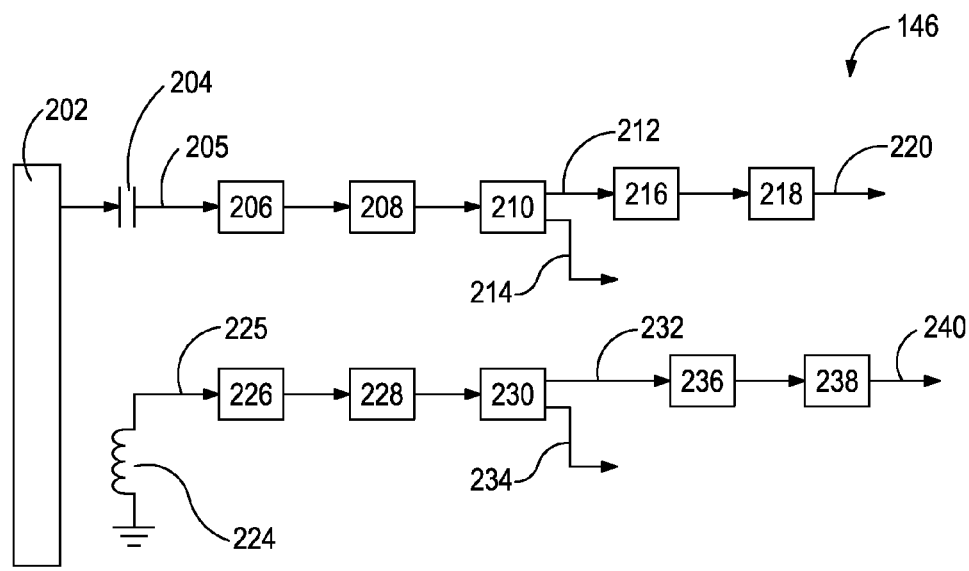
FIG. 2 illustrates an exemplary detector circuit from FIG. 1, according to one or more embodiments described.

FIG. 2 illustrates an exemplary detector circuit 146 from FIG. 1, according to one or more embodiments described. The detector circuit 146 may include a rod 202 or other device coupled to the RF generator 140 (see FIG. 1) and configured to detect or sense the process signal 141 from the RF generator 140. A capacitor 204 may be coupled to the rod 202 and configured to pick up an initial AC voltage ($V_{RMS}$) signal 205 from the RF generator 140 via the rod 202. A first voltage scaler 206 may be coupled to the capacitor 204 and configured to scale the $V_{RMS}$ signal 205 received from the capacitor 204, such as with one or more resistors. A low pass filter 208 may be coupled to the voltage scaler 206 and configured to pass frequencies of the $V_{RMS}$ signal 205 from the voltage scaler 206 below a cutoff frequency and to attenuate frequencies above the cutoff frequency.

In at least one embodiment, a power splitter 210 may be coupled to the low pass filter 208 and configured to split the initial $V_{RMS}$ signal 205 from the low pass filter 208 into a first $V_{RMS}$ signal 212 and a second $V_{RMS}$ signal 214. In at least one embodiment, the power splitter 210 may be or include a telecommunications integrated circuit (telecom IC) having wide bandwidth capabilities. For example, the telecom IC may be operable at variable frequencies between about 400 kHz and about 3 GHz.

A second voltage scaler 216 may be coupled to the power splitter 210 and configured to receive and scale the first $V_{RMS}$ signal 212 from the power splitter 210. The second $V_{RMS}$ signal 214 may be used to, for example, produce a phase difference signal and/or a phase error signal. In at least one embodiment, the power splitter 210 may be omitted (not shown), and the low pass filter 208 may be coupled to the second voltage scaler 216. In this embodiment, there are no first and second $V_{RMS}$ signals 212, 214 produced by the power splitter 210, and the initial $V_{RMS}$ signal 205 is transmitted from the low pass filter 208 to the second voltage scaler 216. For clarity, this description will proceed with the embodiment shown in FIG. 2 having the power splitter 210 and the first $V_{RMS}$ signal 212.

A clamp 218 may be coupled to the voltage scaler 216 and configured to clamp any overshoot and/or undershoot of the first $V_{RMS}$ signal 212 from the voltage scaler 216 and to output a voltage magnitude signal 220 representative of the process signal 141 from the RF generator 140 (see FIG. 1). In at least one embodiment, the voltage magnitude signal 220 may be an RF signal having a frequency between about 300 Hz and about 300 MHz. For example, the voltage magnitude signal 220 may have a frequency between about 30 MHz and about 162 MHz.

An inductor 224 may be coupled to the rod 202 and configured to pick up an initial AC current ($I_{RMS}$) signal 225 from the RF generator 140 via the rod 202. A first current scaler 226 may be coupled to the inductor 224 and configured to scale the $I_{RMS}$ signal 225 received from the inductor 224. A low pass filter 228 may be coupled to the current scaler 226 and configured to pass frequencies of the $I_{RMS}$ signal 225 from the current scaler 226 below a cutoff frequency and to attenuate frequencies above the cutoff frequency.

In at least one embodiment, a power splitter 230 may be coupled to the low pass filter 228 and configured to split the initial $I_{RMS}$ signal 225 from the low pass filter 228 into a first $I_{RMS}$ signal 232 and a second $I_{RMS}$ signal 234. The power splitter 230 may be the same as the first power splitter 210, or it may be a different component, as desired.

A second current scaler 236 may be coupled to the power splitter 230 and configured to receive and scale the first $I_{RMS}$ signal 232 from the power splitter 230. The second $I_{RMS}$ signal 234 may be used to, for example, produce a phase difference signal and/or a phase error signal. In at least one embodiment, the power splitter 230 may be omitted (not shown), and the low pass filter 228 may be coupled to the second current scaler 236. In this embodiment, there are no first and second $I_{RMS}$ signals 232, 234 produced by the power splitter 230, and the initial $I_{RMS}$ signal 225 is transmitted from the low pass filter 228 to the second current scaler 236. For clarity, this description will proceed with the embodiment shown in FIG. 2 having the power splitter 230 and the first $I_{RMS}$ signal 232.

A clamp 238 may be coupled to the current scaler 236 and configured to clamp any overshoot and/or undershoot of the first $I_{RMS}$ signal 232 and to output a current magnitude signal 240 representative of the process signal 141 from the RF generator 140 (see FIG. 1). In at least one embodiment, the current magnitude signal 240 may be an RF signal having a frequency between about 300 Hz and about 300 MHz. For example, the current magnitude signal 240 may have a frequency between about 30 MHz and about 162 MHz.

Figure 3:
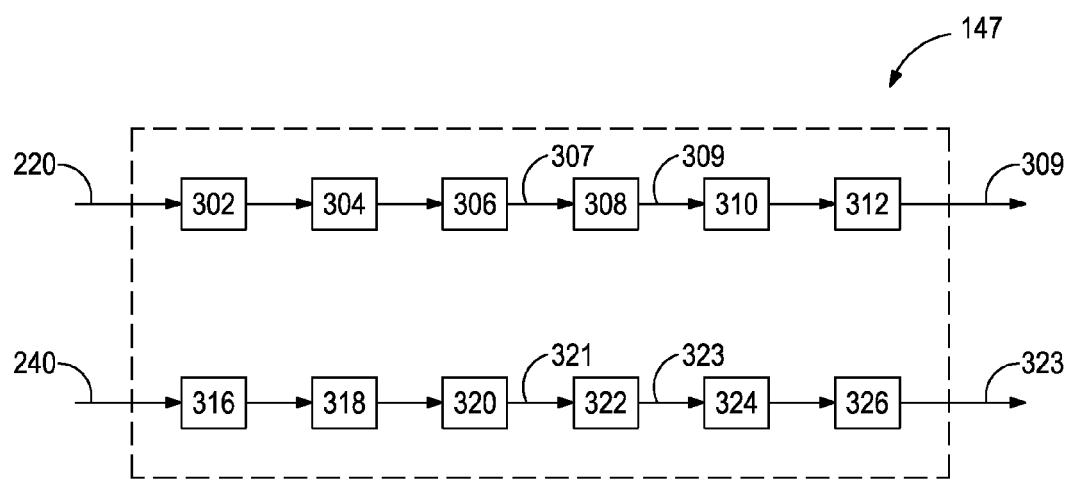
FIG. 3 illustrates an exemplary envelope circuit from FIG. 1, according to one or more embodiments described.

FIG. 3 illustrates an exemplary envelope circuit 147 from FIG. 1, according to one or more embodiments described. The envelope circuit 147 may include a first attenuator 302 configured to receive the voltage magnitude signal 220 from the detector circuit 146 and to introduce an attenuation scalar to the voltage magnitude signal 220. A first low pass filter 304 may be coupled to the attenuator 302 and configured to strip out the voltage magnitude signal 220 as a low pass average. For example, the low pass filter 304 may be a Cauer-I type filter. The low pass filter 304 may be coupled to and drive a first diode peak detector 306 configured to output a DC peak voltage signal that may be filtered and shaped to produce a DC pulse average voltage signal 307. A first holder 308 may be coupled to the peak detector 306. In at least one embodiment, when the RF generator 140 (see FIG. 1) is in pulse mode, the DC pulse average voltage signal 307 pulses on and off, and the holder 308 may sample and hold a pulse of the DC pulse average voltage signal 307 from the peak detector 306 to produce a voltage envelope signal 309 representative of the process signal 141 from the RF generator 140 (see FIG. 1). A first snubber 310 may be coupled to the holder 308 and configured to remove any overshoot and/or undershoot of the voltage envelope signal 309 from the holder 308. A first scaler 312 may be coupled to the snubber 310 and configured to scale the voltage envelope signal 309 from the snubber 310.

The envelope circuit 147 may also include a second attenuator 316 configured to receive the current magnitude signal 240 from the detector circuit 146 and to introduce an attenuation scalar to the current magnitude signal 240. A second low pass filter 318 may be coupled to the attenuator 316 and configured to strip out the current magnitude signal 240 as a low pass average. For example, the low pass filter 318 may be a Cauer-I type filter. The low pass filter 318 may be coupled to and drive a second diode peak detector 320 configured to output a DC peak current signal that may be filtered and shaped to produce a DC pulse average current signal 321. A second holder 322 may be coupled to the peak detector 320. In at least one embodiment, when the RF generator 140 (see FIG. 1) is in pulse mode, the DC pulse average current signal 321 pulses on and off, and the holder 322 may sample and hold a pulse of the DC pulse average current signal 321 from the peak detector 320 to produce a current envelope signal 323 representative of the process signal 141 from the RF generator 140 (see FIG. 1). A second snubber 324 may be coupled to the holder 322 and configured to remove any overshoot and/or undershoot of the current envelope signal 323 from the holder 322. A second scaler 326 may be coupled to the snubber 324 and configured to scale the current envelope signal 323 from the snubber 324.

In operation, with continuing reference to FIGS. 1-3, the RF generator 140 is in pulse mode and supplies the pulsing process signal 141 to the target 118 in the chamber 110. The DC generator 150 also supplies the DC signal 151 to the target 118 in the chamber 110. The second RF generator 160 and/or the third RF generator 170 supply signal(s) to the pedestal 120 in the chamber 110 providing a bias. Gas is introduced to the chamber 110 from the gas supply 128 to facilitate the formation of plasma 105 within the chamber 110. Ionized atoms within the plasma 105, which are positively charged, are attracted to and accelerated toward the target 118, which is negatively charged. Upon impact with the target 118, the ionized atoms dislodge atoms from the target 118. The dislodged atoms become ionized in the plasma 105 and are then accelerated toward the substrate 122 by the magnetic field within the chamber 110.

During this PVD process, the rod 202 of the detector circuit 146 senses the process signal 141 from the RF generator 140, and the capacitor 204 picks up the pulsing $V_{RMS}$ signal 205 from the rod 202. The $V_{RMS}$ signal 205 may be scaled and filtered. In at least one embodiment, the $V_{RMS}$ signal 205 may then be split into two $V_{RMS}$ signals 212, 214, and the first $V_{RMS}$ signal 212 may be scaled and clamped to produce the pulsing voltage magnitude signal 220. In another embodiment, the $V_{RMS}$ signal 205 not be split, and after being filtered, may be scaled and clamped to produce the pulsing voltage magnitude signal 220.

The inductor 230 picks up the pulsing $I_{RMS}$ signal 225 from the rod 202. The $I_{RMS}$ signal 225 may be scaled and filtered. In at least one embodiment, the $I_{RMS}$ signal 231 may then be split into two $I_{RMS}$ signals 232, 234, and the first $I_{RMS}$ signal 232 may be scaled and clamped to produce the pulsing current magnitude signal 240. In another embodiment, the $I_{RMS}$ signal 225 may not be split, and after being filtered, may be scaled and clamped to produce the pulsing current magnitude signal 240.

The envelope circuit 147 may receive the pulsing voltage and current magnitude signals 220, 240 from the detector circuit 146. The pulsing voltage magnitude signal 220 may be attenuated and filtered. The pulsing voltage magnitude signal 220 may then be converted to the pulsing DC peak voltage signal. Each pulse of the DC peak voltage signal may then be filtered and shaped to the DC pulse average voltage signal 307. The magnitude of the DC pulse average voltage signal 307 may vary with each subsequent pulse of the DC peak voltage signal. The DC pulse average voltage signal 307 may be sampled and held to produce the voltage envelope signal 309, which corresponds to the pulsing process signal 141 from the RF generator 140.

The pulsing current magnitude signal 240 from the detector circuit 146 may be received by the envelope circuit 147 and attenuated and filtered. The pulsing current magnitude signal 220 may then be converted to the pulsing DC peak current signal. Each pulse of the DC peak current signal may then be filtered and shaped to the DC pulse average current signal 321. The magnitude of the DC pulse average current signal 321 may vary with each subsequent pulse of the DC peak current signal. The DC pulse average current signal 321 may be sampled and held to produce the current envelope signal 323, which corresponds to the pulsing process signal 141 from the RF generator 140.

The match controller 148 (see FIG. 1) may receive the voltage envelope signal 309 and the current envelope signal 323 from the envelope circuit 147, and in response to the envelope signals 309, 323, the match controller 148 may actively adjust the impedance of the RF matching network 144 while the RF generator 140 is running in pulse mode. The match controller 148 may adjust the impedance of the RF matching network 144 by adjusting variable components within the RF matching network 144. In at least one embodiment, the variable components may be adjusted with stepper motors or the like. In at least one embodiment, the variable components may be or include variable capacitors. As a result, the RF matching network 144 may be actively and continuously tuned in a pulse mode environment to reduce reflected power from the chamber 110 and thereby increase power transfer efficiency from the RF generator 140 to the chamber 110.

Figure 4:
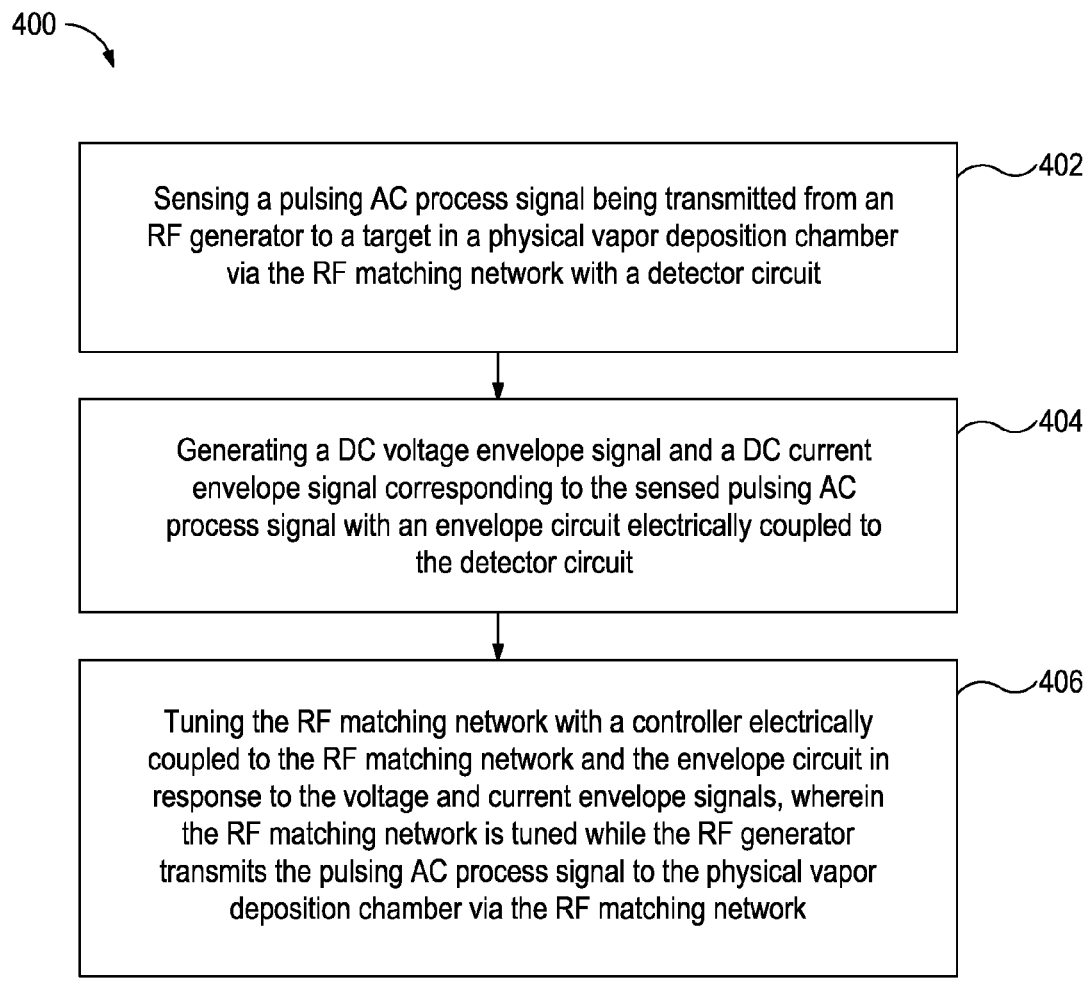
FIG. 4 illustrates an exemplary method for tuning an RF matching network during pulsed mode operation, according to one or more embodiments described.

FIG. 4 illustrates an exemplary method 400 for tuning an RF matching network during pulsed mode operation, according to one or more embodiments described. The method 400 may include sensing a pulsing AC process signal with a detector circuit, as shown at 402. The pulsing AC process signal may be transmitted from an RF generator to a physical vapor deposition chamber via the RF matching network. The method 400 may also include generating a DC voltage envelope signal and a DC current envelope signal corresponding to the sensed pulsing AC process signal with an envelope circuit electrically coupled to the detector circuit, as shown at 404. The method 400 may further include tuning the RF matching network with a controller electrically coupled to the RF matching network and the envelope circuit in response to the voltage and current envelope signals, as shown at 406. The RF matching network may be tuned while the RF generator transmits the pulsing AC process signal to the physical vapor deposition chamber via the RF matching network.

Figure 5:
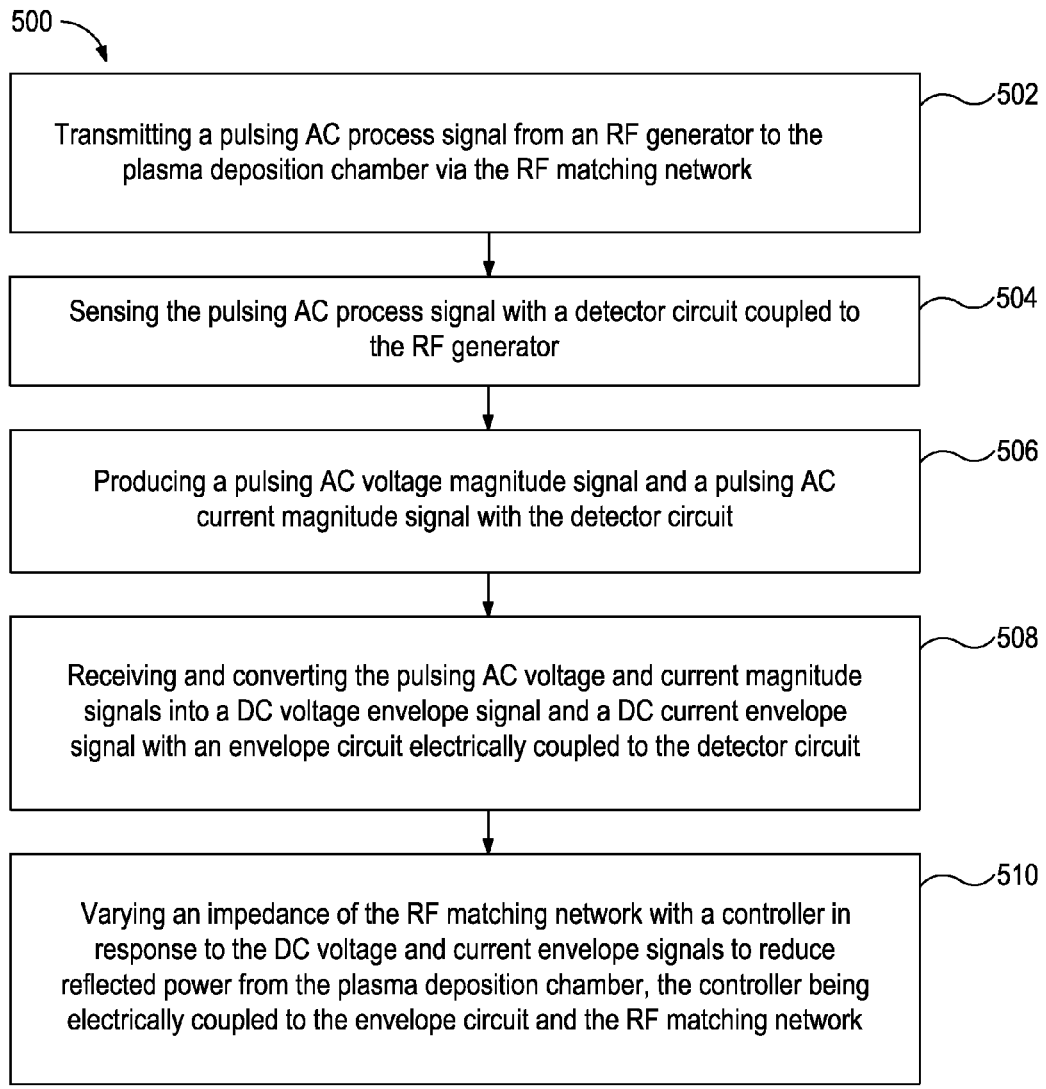
FIG. 5 illustrates an exemplary method for tuning an RF matching network for a plasma deposition chamber during pulse mode operation, according to one or more embodiments described.

FIG. 5 illustrates an exemplary method 500 for tuning an RF matching network for a plasma deposition chamber during pulse mode operation, according to one or more embodiments described. The method 500 may include transmitting a pulsing AC process signal from an RF generator to a plasma deposition chamber via the RF matching network, as shown at 502. The method 500 may also include sensing the pulsing AC process signal with a detector circuit coupled to the RF generator, as shown at 504. The method 500 may further include producing a pulsing AC voltage magnitude signal and a pulsing AC current magnitude signal with the detector circuit, as shown at 506. The method 500 may further include receiving and converting the pulsing AC voltage and current magnitude signals into a DC voltage envelope signal and a DC current envelope signal with an envelope circuit coupled to the detector circuit, as shown at 508. The method 500 may further include varying an impedance of the RF matching network with a controller in response to the DC voltage and current envelope signals to reduce reflected power from the plasma deposition chamber, and the controller may be electrically coupled to the envelope circuit and the RF matching network, as shown at 510.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

I claim:

1. A method for tuning an RF matching network during pulsed mode operation, comprising:
   sensing a pulsing AC process signal being transmitted from an RF generator to a target in a physical vapor deposition chamber via the RF matching network with a detector circuit;
   generating a DC voltage envelope signal and a DC current envelope signal corresponding to the sensed pulsing AC process signal with an envelope circuit electrically coupled to the detector circuit; and
   tuning the RF matching network with a controller electrically coupled to the RF matching network and the envelope circuit in response to the voltage and current envelope signals, wherein the RF matching network is tuned while the RF generator transmits the pulsing AC process signal to the target in the physical vapor deposition chamber via the RF matching network.

2. The method of claim 1, further comprising converting the sensed pulsing AC process signal into a pulsing AC voltage magnitude signal and a pulsing AC current magnitude signal with the detector circuit.

3. The method of claim 2, further comprising converting the pulsing AC voltage and current magnitude signals into a pulsing DC peak voltage signal and a pulsing DC peak current signal with the envelope circuit.

4. The method of claim 3, further comprising converting the pulsing DC peak voltage and current signals into a DC pulse average voltage signal and a DC pulse average current signal with the envelope circuit.

5. The method of claim 4, further comprising converting the DC pulse average voltage and current signals into the DC voltage envelope signal and the DC current envelope signal with the envelope circuit.

6. The method of claim 1, wherein tuning the RF matching network further comprises adjusting a variable impedance of the RF matching network.

7. The method of claim 6, wherein adjusting the variable impedance of the RF matching network further comprises adjusting at least one variable capacitor with at least one stepper motor.

8. A system for tuning an RF matching network during pulsed mode operation, comprising:
   an RF generator configured to supply a pulsing AC process signal to a target in a physical vapor deposition chamber via the RF matching network;
   a detector circuit coupled to the RF generator and configured to sense the pulsing AC process signal and to produce a corresponding pulsing AC voltage magnitude signal and pulsing AC current magnitude signal;
   an envelope circuit electrically coupled to the detector circuit and configured to receive the pulsing AC voltage and current magnitude signals and to produce a DC voltage envelope signal and a DC current envelope signal; and
   a controller electrically coupled to the envelope circuit and the RF matching network and configured to receive the DC voltage and current envelope signals and to vary an impedance of the RF matching network in response to the DC voltage and current envelope signals.

9. The system of claim 8, wherein the envelope circuit comprises:
   a first attenuator configured to receive the pulsing AC voltage magnitude signal from the detector circuit;
   a first filter electrically coupled to the first attenuator and configured to receive the pulsing AC voltage magnitude signal from the first attenuator;
   a second attenuator configured to receive the pulsing AC current magnitude signal from the detector circuit; and
   a second filter electrically coupled to the second attenuator and configured to receive the pulsing AC current magnitude signal from the second attenuator.

10. The system of claim 9, wherein the first and second filters are Cauer filters.

11. The system of claim 8, wherein the envelope circuit comprises:
    a peak voltage detector configured to receive the pulsing AC voltage magnitude signal from the detector circuit; and
    a peak current detector configured to receive the pulsing AC current magnitude signal from the detector circuit.

12. The system of claim 11, wherein the peak voltage detector is electrically coupled to at least one of a first attenuator and a first filter, and wherein the peak current detector is electrically coupled to at least one of a second attenuator and a second filter.

13. The system of claim 11, wherein the envelope circuit further comprises:
    a first holder electrically coupled to the peak voltage detector; and
    a second holder electrically coupled to the peak current detector.

14. The system of claim 13, wherein the envelope circuit further comprises:
a first snubber electrically coupled to the first holder;
a first scaler electrically coupled to the first snubber;
a second snubber electrically coupled to the second holder; and
a second scaler electrically coupled to the second snubber.

15. A method for tuning an RF matching network for a plasma deposition chamber during pulse mode operation, comprising:
transmitting a pulsing AC process signal from an RF generator to the plasma deposition chamber via the RF matching network;
sensing the pulsing AC process signal with a detector circuit coupled to the RF generator;
producing a pulsing AC voltage magnitude signal and a pulsing AC current magnitude signal with the detector circuit;
receiving and converting the pulsing AC voltage and current magnitude signals into a DC voltage envelope signal and a DC current envelope signal with an envelope circuit electrically coupled to the detector circuit; and
varying an impedance of the RF matching network with a controller in response to the DC voltage and current envelope signals to reduce reflected power from the plasma deposition chamber, the controller being electrically coupled to the envelope circuit and the RF matching network.

16. The method of claim 15, further comprising:
converting the pulsing AC voltage magnitude signal into a DC pulse average voltage signal with the envelope circuit; and
converting the pulsing AC current magnitude signal into a DC pulse average current signal with the envelope circuit.

17. The method of claim 16, further comprising:
converting the DC pulse average voltage signal into the voltage envelope signal with the envelope circuit; and
converting the DC pulse average current signal into the current envelope signal with the envelope circuit.

18. The method of claim 15, wherein varying the impedance of the RF matching network comprises adjusting at least one variable capacitor in the RF matching network.

19. The method of claim 18, further comprising adjusting the at least one variable capacitor in the RF matching network with at least one stepper motor.

20. The method of claim 15, further comprising varying the impedance of the RF matching network while the RF generator transmits the pulsing AC process signal to the plasma deposition chamber via the RF matching network.

* * * * *